United States Patent [19]
Sato et al.

[11] Patent Number: 5,486,722
[45] Date of Patent: Jan. 23, 1996

[54] LEAD FRAME HAVING SMALL PITCH BETWEEN OUTER LEADS

[75] Inventors: Naohumi Sato; Yasuhiro Yanagisawa, both of Tokyo, Japan

[73] Assignee: Sumitomo Metal Mining Company, Limited, Tokyo, Japan

[21] Appl. No.: 237,176

[22] Filed: May 3, 1994

[30] Foreign Application Priority Data

May 11, 1993 [JP] Japan ..................................... 5-132918
Mar. 23, 1994 [JP] Japan ..................................... 6-076462

[51] Int. Cl.⁶ ........................ H01L 23/495; H01L 23/28
[52] U.S. Cl. ........................ 257/666; 257/667; 257/669; 257/787
[58] Field of Search ..................................... 257/666, 669, 257/674, 667, 787

[56] References Cited

U.S. PATENT DOCUMENTS

| | | | |
|---|---|---|---|
| 4,331,740 | 5/1982 | Burns ..................................... | 257/674 |
| 4,496,965 | 1/1985 | Orcutt et al. ............................ | 257/669 |
| 5,150,193 | 9/1992 | Yasuhara et al. ....................... | 257/669 |
| 5,150,194 | 9/1992 | Brooks et al. .......................... | 257/669 |

*Primary Examiner*—Robert P. Limanek
*Assistant Examiner*—David Ostrowski
*Attorney, Agent, or Firm*—Watson, Cole, Grindle & Watson

[57] ABSTRACT

A lead frame in which a bulgy portion is disposed to each of inner leads or outer leads at a position corresponding to a mold line, whereby a lead gap in the portion is defined as less than 0.15 mm.

The lead frame has such a shape as causing less resin leakage upon applying resin molding to a packaging main body upon preparing an IC plastic package. This enables to improve the yield in preparing the IC plastic package and reduce the manufacturing cost.

3 Claims, 5 Drawing Sheets

LEAD FRAME HAVING SMALL PITCH BETWEEN OUTER LEADS

BACKGROUND OF THE INVENTION

1. Field of the Invention

The present invention concerns a lead frame for use in a semiconductor integrated circuit device and, more in particular, it relates to a lead frame suitable to use in a high pin count LSI package with an outer lead pitch of less than 0.5 mm.

2. Description of the Prior Art

Along with the progress in an improvement for the functions of semiconductor integrated circuits such as in microcomputers or gate arrays, high pin count technique has now been under development in plastic packages in which semiconductors are resin-encapsulated.

FIG. 3 shows an appearance of an existent lead frame used for the assembly of a QFP (Quad Flat Package), which is an existent general surface mounting IC plastic package. Details for the specification of the QFP are defined in the Standards of Electronic Machine Industry Association of Japan (EIAJ) in IC-74-4.

In FIG. 3, a lead frame 1 has a rectangular die pad 2 disposed at a central area thereof for mounting a semiconductor chip, around which leads 3 connected electrically with the semiconductor chip by way of lead wires such as gold wires are disposed. The die pad 2 is supported by suspending leads 4. The lead 3 is divided into an inner lead part 3a which is a portion encapsulated with a resin and an outer lead part 3b which is a portion exposed to the outside when the package main body is molded. A boundary between the package main body and the outside is referred to as a mold line 5 (shown by a dotted line).

In the existent lead frame, a tie bar (also referred to as a dam bar) 6 for connecting the outer lead parts 3b to each other is disposed at a position to the outer circumference by 2 to 3 mm of the mold line 5 for preventing the resin from leaking outwardly between each of the leads upon molding. The outer circumferential portion of the lead frame 1 comprises an outer frame 7 and an inner frame 8, and guide holes 9 used upon molding for positioning are disposed to the outer frame 7. The lead frame 1 is generally made of an electroconductive material such as 42 alloy or copper alloy, which is molded by pressing or etching and has a thickness generally of about 0.125 mm to 0.2 mm. The pitch of the outer lead 3b was about 0.5 mm in an early stage but the pitch has become narrower such as 0.4 mm or 0.3 mm since the high-pin count technique has been developed more in recent years.

For assembling a QFP by using the existent usual lead frame as described above, the semiconductor chip is at first bonded to the die pad 2 by using a solder or epoxy type adhesive. Then, an electrode pad on the semiconductor chip and the inner leads 3a are connected by way of lead wires such as fine gold or aluminum wires. Subsequently, the lead frame is mounted to mold tools and a package main body is prepared by extrusion molding of a heat resistant synthetic resin such as an epoxy resin. FIG. 4 is a plane view showing the state of the surface of the lead frame after resin molding in which a solid black portion shows a resin molded portion.

Vents are disposed to the molding tools for smooth injection molding of the resin.

The resin does not leak through the air vents upon molding owing to the appropriate viscosity of the resin but the resin leaks between the leads to the tie bar 6 to form resin flash 10 as shown in FIG. 5.

After completion of the molding, the tie bars 6 connecting the individual outer leads and the suspending leads 4 are cut by using the tool. FIG. 5 is a plan view illustrating the state for the appearance of the lead frame after cutting the tie bars, in which a solid black portion also shows the resin. As shown in FIG. 5, the resin flash still deposits to the outer leads even after the cutting. Then, an operation for removing the resin flash by blowing pressurized water is applied. Subsequently, the outer lead portion is cut and separated from the outer frame 7 and the inner frame 8 by using the trim and form tools to shape the outer leads into a predetermined configuration.

However, in the series of steps described above, as the pitch of the outer Leads is made smaller to less than 0.5 mm, it results in problems that a manufacturing cost for the tools used for cutting in the step of cutting the tie bar is remarkably increased and that a frequency for the occurrence of defect such as bending to the outer lead is increased. In addition, since pressurized water at a higher pressure has to be used in order to remove the resin remaining in the fine gap, there may be a risk of damaging the package main body.

OBJECT OF THE INVENTION

An object of the present invention is to overcome the foregoing problems in preparing a high-pin count and narrower pitch IC plastic package and provide a lead frame having such a configuration as causing less resin leakage upon molding a package main body, thereby improving the yield upon preparing the IC plastic package and reducing the manufacturing cost.

SUMMARY OF THE INVENTION

The foregoing object of the present invention can be attained by a lead frame in which a bulgy portion is disposed to each of inner leads or outer leads at a position corresponding to a mold line, whereby a lead gap at that portion is made to less than 0.15 mm, preferably, from 0.06 to 0.15 mm.

As has been described above in the lead frame according to the present invention, since the bulgy portion is disposed to the inner lead or the outer lead at a position corresponding to the mold line, the lead gap at that portion is made as narrow as less than 0.15 mm, preferably, 0.06 mm to 1.15 mm, a molded resin does not leak through a gap between each of the leads owing to the viscosity of the resin upon molding the resin. Accordingly, since the tie bars which were disposed so far to the outer leads for preventing the resin leakage are no more required, the tie bar cutting step is no more necessary in the succeeding step, so that manufacturing cost can be reduced by decreasing the number of steps and occurrence of failed products due to bending of leads upon practicing the cutting step can be prevented. Furthermore, since it is possible to avoid occurrence of flash caused by the resin leaked to an area from the package main body to the tie bar upon practicing the present invention, it can also provide a merit of saving the operation for removing the resin flash by spraying pressurized water.

BRIEF DESCRIPTION OF THE DRAWINGS

FIG. 1 is a schematic view illustrating a lead frame according to the present invention, in which

FIG. 2 is a view illustrating the surface state of a lead frame after applying resin molding using the lead frame according to the present invention in which

EXAMPLE

Descriptions will now be made to a preferred embodiments of the present invention.

EXAMPLE 1

Figure 1A:
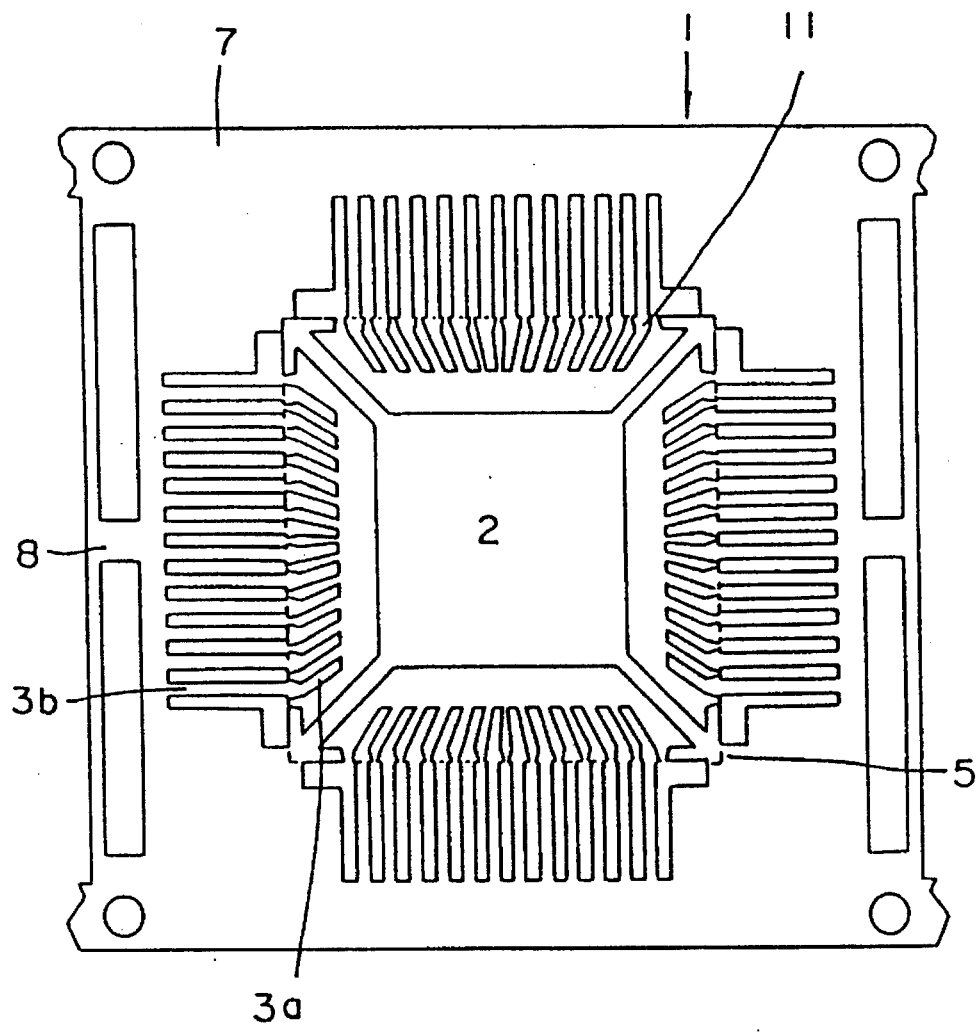
Fig. 1(a) is a plan view and Fig. 1(b) is an enlarged view for a bulky portion of a lead at a mold line shown in Fig. 1(a)
Figure 1B:
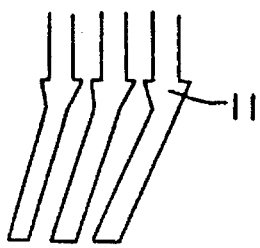
Figure 3:
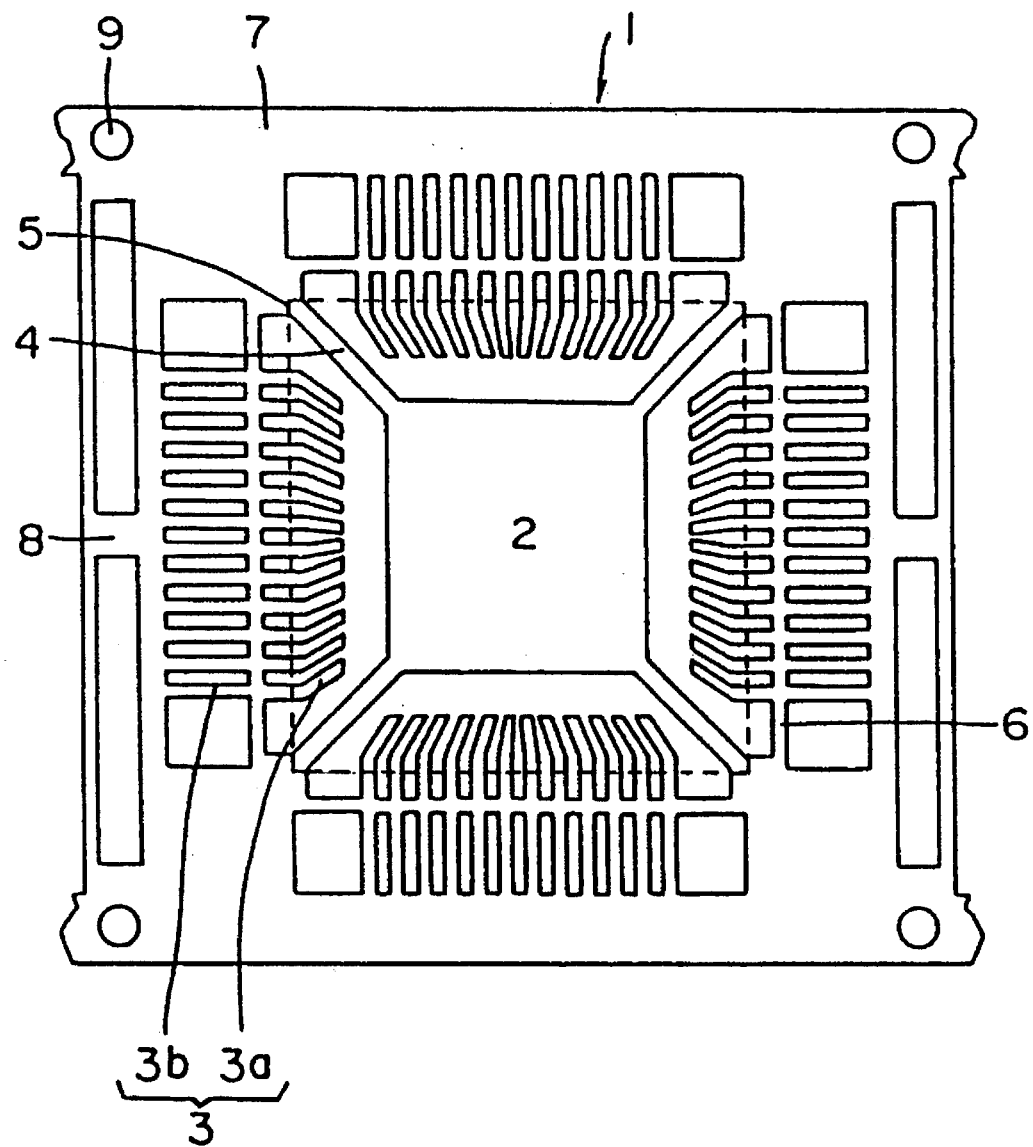
FIG. 3 is a schematic plan view of an existent lead frame.
Figure 4:
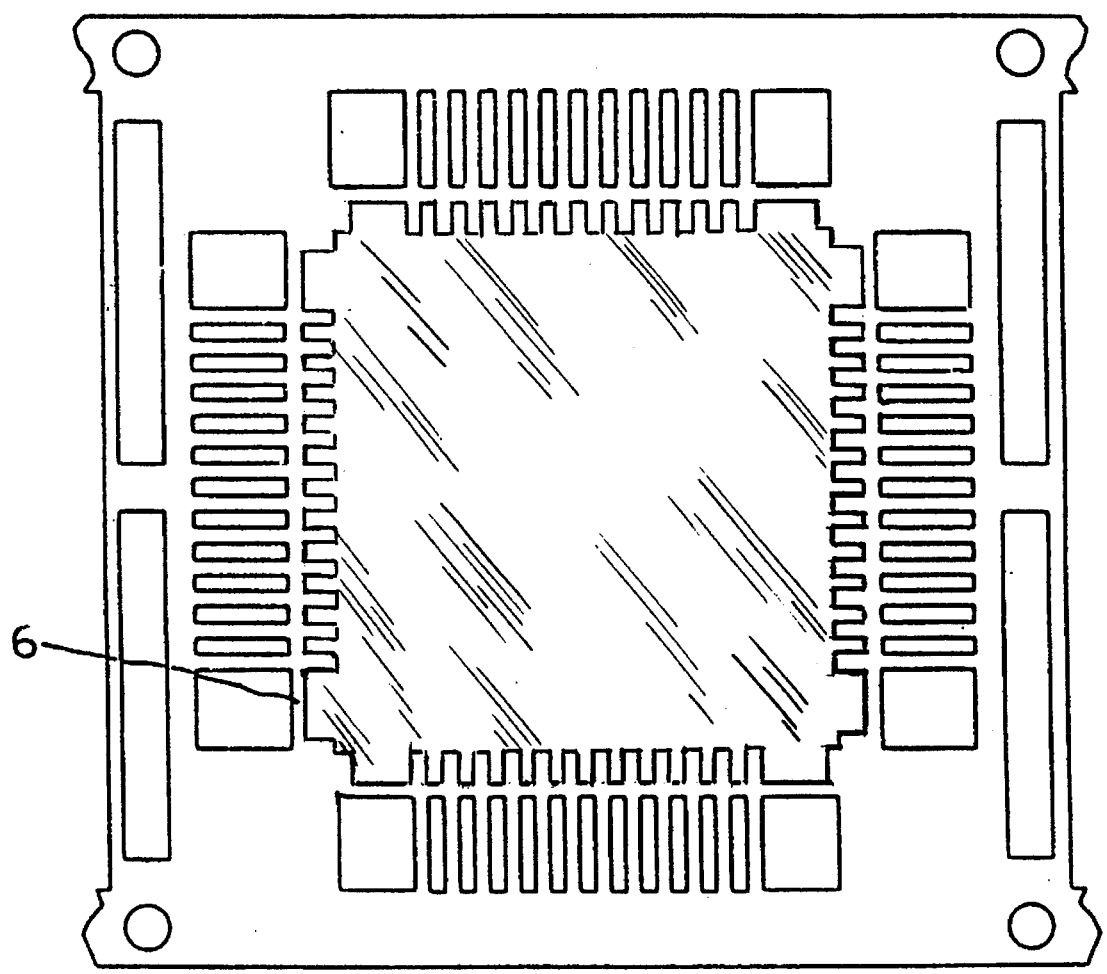
FIG. 4 is a plan view illustrating the surface state of a lead frame after applying resin molding using the lead frame shown in FIG. 3
Figure 5:
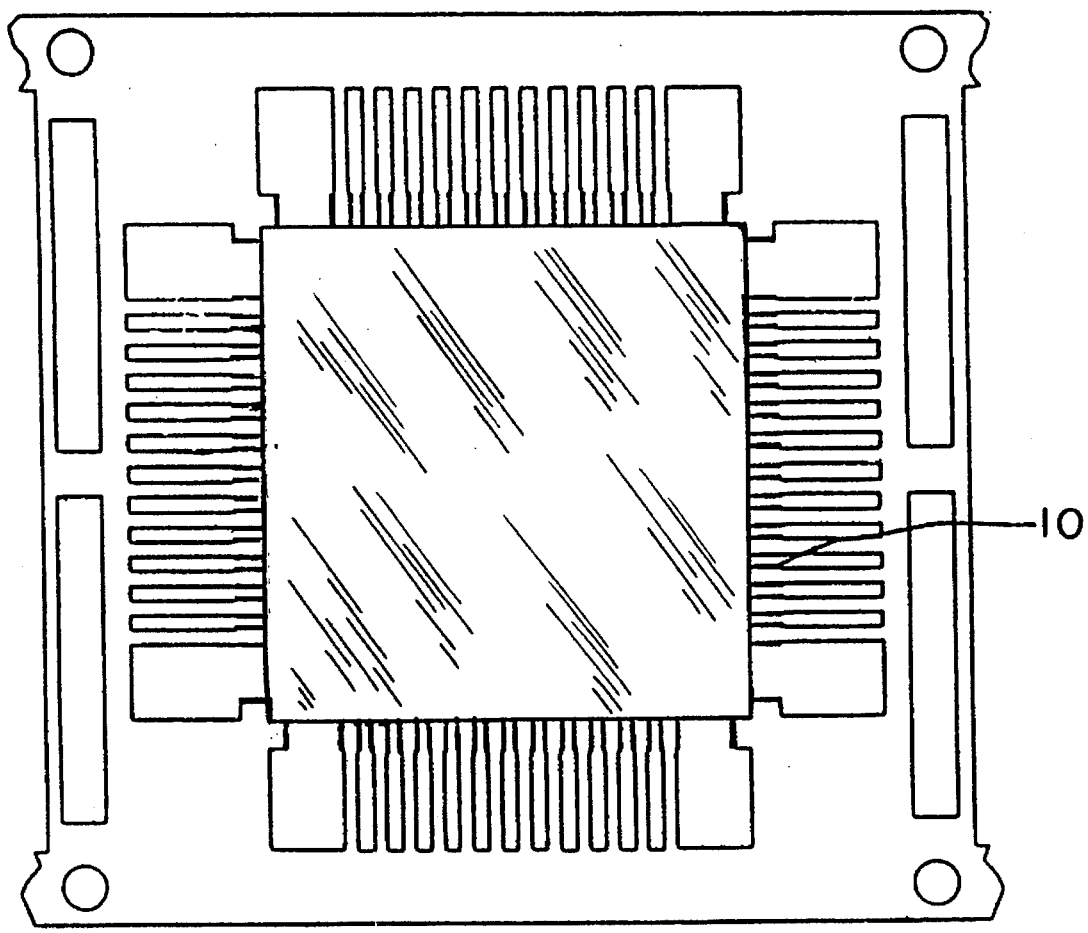
FIG. 5 is a plan view illustrating the state of the surface on the lead frame after cutting the tie bars.

FIG. 1 is a view illustrating an appearance of a lead frame according to the present invention, in which FIG. 1(a) is a schematic plan view and FIG. 1(b) is an enlarged view for a portion of leads corresponding to a mold line 5 (area surrounded by a circle) in FIG. 1(a) above. Since each of the portions of the lead frame 1 is identical with each of the corresponding portions of the existent lead frame shown in FIG. 3, duplicate explanation therefor will be omitted. In the lead frame according to the present invention, as shown clearly by the enlarged view in FIG. 1(b), a bulgy portion is disposed to a portion of a lead at a mold line 5 and the gap between each of the leads in this portion is formed much narrower than that between each of the leads determined so far in the lead frame. In this embodiment, the bulgy portion 11 is disposed to a portion of the lead at the mold line 5 in a case where the pitch of the outer lead is defined as 0.5 mm in a lead frame for a QFP, so that the lead gap at that narrowed portion is made to 0.1 mm.

For assembling the QFP using the lead frame described above, procedures from fixing of the semiconductor chip on the die pad to the formation of the packed main body by the resin molding are conducted in the same way as the prior art. Upon resin molding, in the present invention, since the bulgy portion 11 is formed to each of the leads at the outer circumferential portion of the molding, that is, at the mold line, to narrow the gap between each of the leads to 0.1 mm, the resin does not leak externally from the mold line owing to the viscosity of the resin.

Figures 2A, 2B:
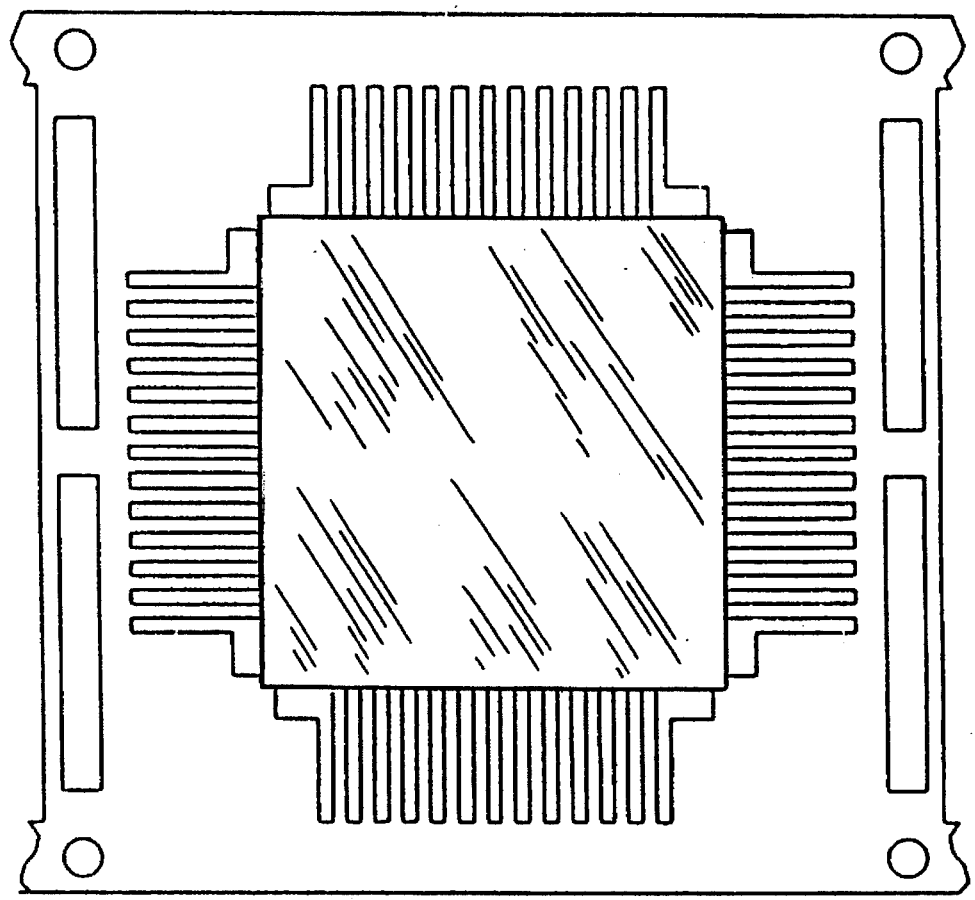
FIG. 2(a) is an plan view and FIG 2(b) is an enlarged view at the mold line in FIG. 2(a)

FIG. 2 is a view illustrating the state after molding the lead frame in this embodiment, in which FIG. 2(a) is a plan view and FIG. 2(b) is an enlarged view for the state of the bulgy portion 11 in FIG. 2a. It can be seen from the drawings that the resin does not leak from the die through the gap between each of the leads to the outside of the mold line upon resin molding but is exactly contained at the position of the mold line owing to the presence of the lead bulky portion 11 in the lead frame of the present invention.

Accordingly, no resin burrs occur on the outer lead portion and operation for removing the resin burrs by pressurized water or the like can be saved. Naturally since there is no requirement for disposing the tie bar for preventing the resin from leaking out of the mold line in the lead frame according to the present invention, usual tie bar cutting step by using the cutting mold can also be saved, so that the lead frame can be transferred directly to the shaping step for the outer lead portion 3b after completing the resin molding step, and the IC plastic package can be prepared at high efficiency.

EXAMPLE 2

A bulky portion 11 is disposed to the lead frame 1 shown in FIG. 1 to define a lead gap as 0.06 mm. When a QFP with an outer lead pitch of 0.4 mm was manufactured by using the lead frame 1 a semiconductor chip was bonded and fixed and the pad on the semiconductor chip was connected with inner leads by gold wires and then the lead frame was mounted to the die and the resin molding was applied in the same procedures as in the prior art. Upon resin molding, the resin did not leak to the outside from the bulgy portion 11 that narrowed the lead gap to 0.06 mm owing to the appropriate viscosity of the resin itself. In addition, since leakage of the resin was prevented at the bulky portion narrowing the lead gap to 0.06 mm, resin burrs did not occur and resin burr removing step was no more required. Therefore, after completing the resin molding step, the resin molded lead frame can be put directly to the shaping step for the outer lead part 3b without the tie bar (dam bar) cutting step and the resin burr removing step.

Accordingly, defect of the bending deformation of the outer lead did not result at all by tie bar-(dam bar) cutting and the package was not damaged at all by pressurized water used for the removal of the resin burrs.

Although descriptions have been made with reference to the embodiments of the present invention made by the present inventor, the present invention is not restricted only to the preferred embodiments but various modifications are possible within the scope of the invention.

That is, although descriptions have been made in each of the preferred embodiments to the QFP lead frame having the outer lead gap of 0.5 mm or 0.4 mm and the lead gap at the mold line narrowed to 0.1 mm or 0.06 mm, by the formation of the bulgy portion of the lead, the present invention is not restricted only thereto but is applicable generally for IC plastic packages of other shapes.

As has been described previously, the lead frame according to the present invention can provide remarkable advantages. For instance, since the tie bar cutting step is no more necessary in the step of assembling the IC plastic package, occurrence of defective products with bending of the outer leads caused by the cutting of the tie bar can be eliminated at all. In addition, since the step for removing the resin burrs is no more necessary, damages to the package caused by pressurized water used for the removal of the resin burrs can be eliminated. Further, since such steps can be saved, the manufacturing cost for the IC package can be reduced remarkably by decreasing the number of steps.

What is claimed is:

1. A lead frame for a semiconductor device, comprising a die pad disposed at a central area of the lead frame for mounting a semiconductor chip, and a plurality of leads surrounding said die pad, each lead being divided into an inner lead portion which is to be encapsulated with a resin material and an outer lead portion, which is not to be encapsulated by said resin, and a mold line defined at the intersection of the inner and outer portions of each lead, said outer lead portions along each side of said frame being spaced from one another along the respective side of said frame, said inner lead portions being spaced from one between adjacent inner lead portions, each lead having a portion of greatest width adjacent said mold line and including side edge portions which continously taper outwardly away from one another toward said mold line in an area adjacent said mold line so that each of said spaces in an area adjacent said mold line, continuously tapers inwardly to a point adjacent said mold line to form a gap between leads of less than 0.15 mm at said mold line to substantially prevent flowable resin material supplied to said central area from flowing past said mold line.

2. A lead frame as defined in claim 1, wherein the outer leads on the mold line are pitched at an interval of from 0.06 mm to 0.15 mm.

3. A lead frame as defined in claim 1, wherein the outer leads are pitched at an interval of from 0.3 mm to 0.4 mm between the first widths thereof.

* * * * *